(12) United States Patent
Kwon et al.

(10) Patent No.: US 11,972,939 B2
(45) Date of Patent: Apr. 30, 2024

(54) METHOD AND APPARATUS FOR TREATING SUBSTRATE

(71) Applicant: SEMES CO., LTD., Chungcheongnam-do (KR)

(72) Inventors: Ohyeol Kwon, Chungcheongnam-do (KR); Jun Keon Ahn, Sejong-si (KR); Soo Young Park, Incheon (KR); Jung Hwan Lee, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 347 days.

(21) Appl. No.: 16/901,913

(22) Filed: Jun. 15, 2020

(65) Prior Publication Data

US 2020/0395210 A1 Dec. 17, 2020

(30) Foreign Application Priority Data

Jun. 17, 2019 (KR) .................. 10-2019-0071352

(51) Int. Cl.
*H01L 21/02* (2006.01)
*B23K 26/0622* (2014.01)
(Continued)

(52) U.S. Cl.
CPC .... *H01L 21/02098* (2013.01); *B23K 26/0624* (2015.10); *B23K 26/36* (2013.01); *B23K 26/362* (2013.01); *H01L 21/02021* (2013.01); *H01L 21/02087* (2013.01); *H01L 21/67069* (2013.01); *H01L 21/67242* (2013.01); *H01L 21/67253* (2013.01); *H01L 21/68764* (2013.01); *H01L 22/12* (2013.01); *H01L 22/20* (2013.01)

(58) Field of Classification Search
CPC ......... H01L 21/02098; H01L 21/02087; H01L 21/67242; H01L 21/67253; H01L 21/68764; H01L 22/12; B23K 26/36; B23K 26/0624; B23K 26/362
See application file for complete search history.

(56) References Cited

U.S. PATENT DOCUMENTS 8,410,394 B2 * 4/2013 Millman, Jr. ...... B23K 26/0622
219/121.76
8,730,317 B2 * 5/2014 Koga ................ H01L 21/67288
348/87

(Continued)

FOREIGN PATENT DOCUMENTS

CN 1550283 A 12/2004
CN 101647126 A 2/2010
(Continued)

OTHER PUBLICATIONS

Translation of JP-2008110401-A (Year: 2008).*
(Continued)

*Primary Examiner* — Elizabeth M Kerr
(74) *Attorney, Agent, or Firm* — Procopio, Cory, Hargreaves & Savitch LLP (57) ABSTRACT

The inventive concept provides a method for treating a substrate. The method includes removing a film on the substrate by applying a pulsed laser to the rotating substrate, in which thickness of the film to be removed is measured and pulse energy of the pulsed laser is selected based on the measured thickness of the film.

8 Claims, 10 Drawing Sheets

(51) Int. Cl.
  *B23K 26/36* (2014.01)
  *B23K 26/362* (2014.01)
  *H01L 21/66* (2006.01)
  *H01L 21/67* (2006.01)
  *H01L 21/687* (2006.01)

(56) References Cited

U.S. PATENT DOCUMENTS

| | | | | |
|---|---|---|---|---|
| 10,948,825 | B2* | 3/2021 | Berendsen | G03F 7/2028 |
| 2005/0020087 | A1* | 1/2005 | Wagner | B23K 26/082 |
| | | | | 438/700 |
| 2006/0292714 | A1* | 12/2006 | Kim | H01L 21/681 |
| | | | | 438/16 |
| 2011/0117681 | A1* | 5/2011 | Bardos | H01L 22/20 |
| | | | | 257/E21.526 |
| 2013/0160792 | A1* | 6/2013 | Xue | B08B 7/0042 |
| | | | | 134/1 |

FOREIGN PATENT DOCUMENTS

| | | | | |
|---|---|---|---|---|
| CN | 102339899 | A | 2/2012 | |
| CN | 102995019 | A | 3/2013 | |
| CN | 107437513 | A | 12/2017 | |
| CN | 108962743 | A | 12/2018 | |
| JP | 07-307314 | A | 11/1995 | |
| JP | H07307314 | A | 11/1995 | |
| JP | H11135726 | A | 5/1999 | |
| JP | 2008-110401 | A | 5/2008 | |
| JP | 2008110401 | A | 5/2008 | |
| JP | 2008110401 | A * | 5/2008 | ......... B23K 26/0622 |
| JP | 2014504004 | A | 2/2014 | |
| KR | 10-20010070532 | A | 7/2001 | |
| KR | 10-20040061442 | A | 7/2004 | |
| KR | 20040092428 | A | 11/2004 | |
| KR | 10-20060135337 | A | 12/2006 | |
| KR | 10-20110077246 | A | 7/2011 | |
| KR | 10-20110085079 | A | 7/2011 | |
| KR | 10-2012-0120670 | A | 11/2012 | |
| KR | 10-2015-0141140 | A | 6/2015 | |
| KR | 10-1557586 | B | 10/2015 | |
| KR | 10-2019-0013988 | A | 2/2019 | |
| WO | 2012075249 | A1 | 6/2012 | |

OTHER PUBLICATIONS

Office Action for related Korean Patent Application No. 10-2019-0071352, dated Nov. 10, 2020 (6 pages).
Korea Notice of Allowance corresponding to Korean Application 9-5-2021-047800479, dated Jun. 16, 2021 (5 pages).
Chinese Patent Office. Chinese Office Action dated Aug. 9, 2022. Chinese Patent Application No. 20201053098.7. Chinese Language only. 10 pages.

* cited by examiner

FIG. 1

Related Art

FIG. 2

Related Art

| Film type \ film thickness | P1 | P2 | P3 | ... |
|---|---|---|---|---|
| F1 | E11 | E12 | E13 | ... |
| F2 | E21 | E22 | E23 | ... |
| F3 | E31 | E32 | E33 | ... |
| ⋮ | ⋮ | ⋮ | ⋮ | ⋮ |

METHOD AND APPARATUS FOR TREATING SUBSTRATE

CROSS-REFERENCE TO RELATED APPLICATIONS

A claim for priority under 35 U.S.C. § 119 is made to Korean Patent Application No. 10-2019-0071352 filed on Jun. 17, 2019, in the Korean Intellectual Property Office, the entire contents of which are hereby incorporated by reference.

BACKGROUND

Embodiments of the inventive concept described herein relate to a method and apparatus for treating a substrate.

Various processes, such as coating, photolithography, deposition, ashing, etching, ion implantation, and the like, are performed to treat a substrate, for example, a semiconductor wafer or a glass panel used to manufacture a flat panel display. As a treating process is performed on a substrate, a cured thin film is applied to or deposited on a surface of the substrate. An edge bead removal process is required to raise production yield at an edge of the substrate. In the edge bead removal process, an unwanted thin film and an attached by-product polymer are removed from an edge area of the substrate.

Figure 1:
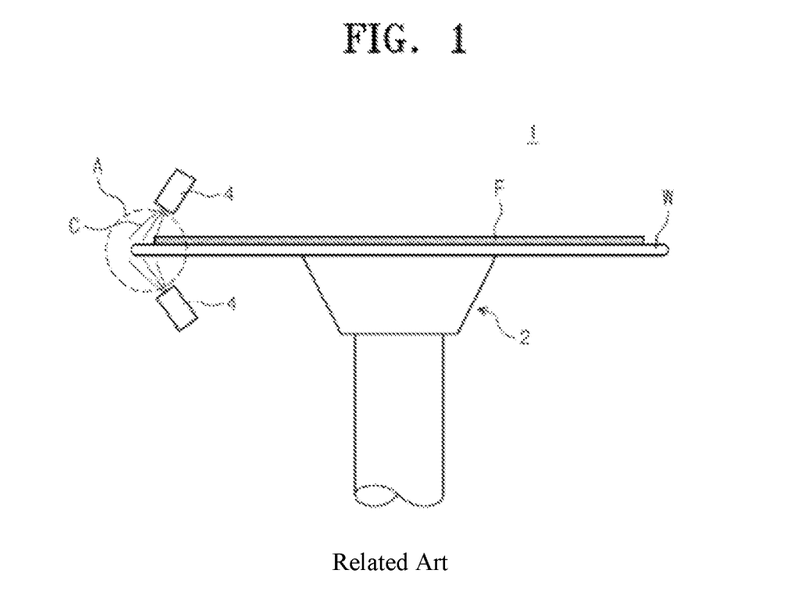
FIG. 1 is a view illustrating a state in which an edge bead removal process is performed in a general substrate treating apparatus.
Figure 2:
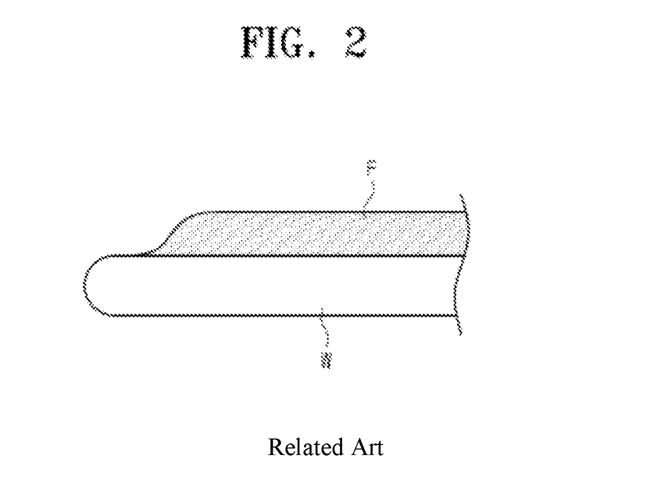
FIG. 2 is an enlarged view illustrating region A in FIG. 1.

FIG. 1 is a view illustrating a state in which an edge bead removal process is performed in a general substrate treating apparatus. Referring to FIG. 1, the general substrate treating apparatus 1 has a rotary chuck 2 and nozzles 4. The rotary chuck 2 supports and rotates a substrate W. The nozzles 4 dispense a chemical C onto an edge area of the substrate W. The nozzles 4 are provided above and below the substrate W and dispense the chemical C onto the top side and the back side of the substrate W. The dispensed chemical C removes a thin film F on the edge area of the substrate W. However, in the case of performing the edge bead removal process using the chemical C, the removal of the thin film F from the edge area of the substrate W is not appropriately performed. For example, as illustrated in FIG. 2, the thin film F on the edge area of the substrate W may be removed so as to be downwardly inclined along the radial direction of the substrate W. This is because the liquid chemical C is dispensed while the substrate W is rotated. When the removal of the thin film F from the edge area of the substrate W is not appropriately performed, the yield of a manufacturing process is lowered. Furthermore, after the process, a pin mark is formed on a surface of the substrate W to cause additional contamination.

SUMMARY

Embodiments of the inventive concept provide a substrate treating method and apparatus for improving efficiency in removing a film on a substrate.

Embodiments of the inventive concept provide a substrate treating method and apparatus for improving film removal efficiency by applying a pulsed laser to a film on a substrate.

Embodiments of the inventive concept provide a substrate treating method and apparatus for making a film removal area fine by applying a pulsed laser to a film on a substrate.

Embodiments of the inventive concept provide a substrate treating method and apparatus for improving substrate treating efficiency by allowing a film on a substrate to be completely removed depending on the thickness of the film on the substrate.

Embodiments of the inventive concept provide a substrate treating method and apparatus for minimizing damage to a substrate due to an over etch, or improper removal of a film due to an under etch, while removing the film on the substrate.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, a method for treating a substrate includes removing a film on the substrate by applying a pulsed laser to the rotating substrate, in which thickness of the film to be removed is measured and pulse energy of the pulsed laser is selected based on the measured thickness of the film.

According to an embodiment, depending on the thickness of the film, the pulse energy may be selected based on ablation energy by which the film is completely removed.

According to an embodiment, the pulse energy may correspond to the ablation energy.

According to an embodiment, the film may include a first film and a second film different from the first film, and the first film and the second film may be stacked on each other. Depending on thickness of the first film, the pulse energy may be selected based on first ablation energy, by which the first film is completely removed, when the first film is removed, and depending on thickness of the second film, the pulse energy may be selected based on second ablation energy, by which the second film is completely removed, when the second film is removed.

According to an embodiment, the pulse energy corresponding to the first ablation energy may be selected when the first film is removed, and the pulse energy corresponding to the second ablation energy may be selected when the second film is removed.

According to an embodiment, the pulse energy may be adjusted by controlling output power of the pulsed laser and/or a repetition rate of the pulsed laser.

According to an embodiment, an area to which the pulsed laser is applied may be an edge area of the substrate.

According to an embodiment, an area where the thickness of the film is measured may be an edge area of the substrate.

According to an embodiment, the measurement of the thickness of the film and the application of the pulsed laser may be sequentially performed.

According to an embodiment, the measurement of the thickness of the film and the application of the pulsed laser may be simultaneously performed.

According to an exemplary embodiment, an apparatus for treating a substrate includes a housing having an interior space, a support unit that supports and rotates the substrate in the interior space, a laser unit that applies a pulsed laser to remove a film on the substrate supported on the support unit, a measurement unit that measures thickness of the film on the substrate, and a controller that controls the laser unit and the measurement unit. The controller includes a recipe memory unit in which treatment conditions for removing the film on the substrate are recorded and an execution unit that reads the treatment conditions from the recipe memory unit and outputs a control signal to control pulse energy of the pulsed laser, based on the read treatment conditions. The execution unit reads the treatment conditions from the recipe memory unit depending on the thickness of the film measured by the measurement unit and outputs the control signal to control the pulse energy, based on the treatment conditions read from the recipe memory unit.

According to an embodiment, the execution unit may read ablation energy, by which the film is completely removed, from the recipe memory unit depending on the thickness of the film measured by the measurement unit among the treatment conditions and may output the control signal to control the pulse energy, based on the ablation energy read from the recipe memory unit.

According to an embodiment, the execution unit may output the control signal such that the pulse energy has energy corresponding to the ablation energy.

According to an embodiment, the film may include a first film and a second film different from the first film, and the first film and the second film may be stacked on each other. The execution unit, when removing the first film, may read first ablation energy, by which the first film is completely removed, from the recipe memory unit depending on thickness of the first film measured by the measurement unit among the treatment conditions and may output the control signal to control the pulse energy, based on the first ablation energy read from the recipe memory unit. The execution unit, when removing the second film, may read second ablation energy, by which the second film is completely removed, from the recipe memory unit depending on thickness of the second film measured by the measurement unit among the treatment conditions and may output the control signal to control the pulse energy, based on the second ablation energy read from the recipe memory unit.

According to an embodiment, the execution unit, when removing the first film, may output the control signal such that the pulse energy has energy corresponding to the first ablation energy. The execution unit, when removing the second film, may output the control signal such that the pulse energy has energy corresponding to the second ablation energy.

According to an embodiment, the execution unit may adjust the pulse energy by outputting a control signal to control output power of the pulsed laser and/or a repetition rate of the pulsed laser.

According to an embodiment, the controller may control the laser unit to apply the pulsed laser to an edge area of the substrate.

According to an embodiment, the controller may control the measurement unit such that an area where the thickness of the film is measured corresponds to an edge area of the substrate.

According to an embodiment, the controller may control the laser unit and the measurement unit such that the measurement of the thickness of the film and the application of the pulsed laser are sequentially performed.

According to an embodiment, the controller may control the laser unit and the measurement unit such that the measurement of the thickness of the film and the application of the pulsed laser are simultaneously performed.

According to an embodiment, the laser unit may include a laser source that emits the pulsed laser, a vision member that takes an image of an edge area of the substrate to measure an offset value between an illuminated position and a set position of the pulsed laser, and an adjustment unit that changes the illuminated position, based on the offset value.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Hereinafter, embodiments of the inventive concept will be described in detail with reference to FIGS. 3 to 17.

Figure 3:
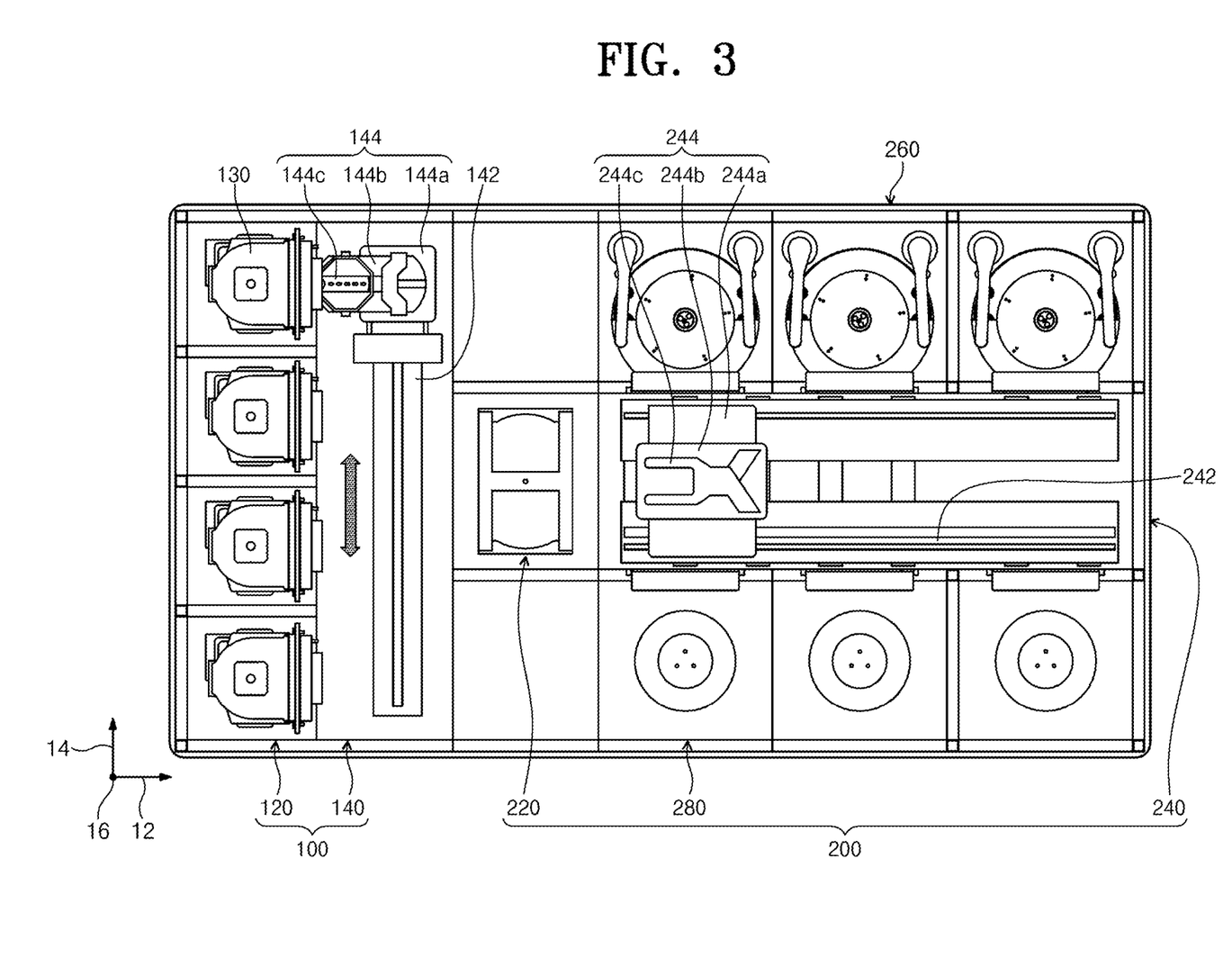
FIG. 3 is a plan view illustrating substrate treating equipment according to an embodiment of the inventive concept.

FIG. 3 is a plan view illustrating substrate treating equipment according to an embodiment of the inventive concept.

Referring to FIG. 3, the substrate treating equipment 10 has an index module 100 and a process module 200. The index module 100 has a load port 120 and a transfer frame 140. The load port 120, the transfer frame 140, and the process module 200 are sequentially arranged in a row. Hereinafter, the direction in which the load port 120, the transfer frame 140, and the process module 200 are arranged is referred to as a first direction 12, a direction perpendicular to the first direction 12 when viewed from above is referred to as a second direction 14, and a direction perpendicular to the plane including the first direction 12 and the second direction 14 is referred to as a third direction 16.

A carrier 130 having substrates W received therein is seated on the load port 120. A plurality of load ports 120 are provided. The load ports 120 are disposed in a row along the second direction 14. The number of load ports 120 may be increased or decreased depending on process efficiency and footprint conditions of the process module 200. The carrier 130 has a plurality of slots (not illustrated) formed therein in which the substrates W are received in horizontal positions relative to the ground. A front opening unified pod (FOUP) may be used as the carrier 130.

The process module 200 includes a buffer unit 220, a transfer chamber 240, a liquid treating chamber 260, and a laser treating chamber 280. The transfer chamber 240 is disposed such that the lengthwise direction thereof is parallel to the first direction 12. The liquid treating chamber 260 and the laser treating chamber 280 are disposed on opposite sides of the transfer chamber 240. On the opposite sides of the transfer chamber 240, the liquid treating chamber 260 and the laser treating chamber 280 are provided to be symmetric to each other with respect to the transfer chamber 240. A plurality of liquid treating chambers 260 are provided on one side of the transfer chamber 240. Some of the liquid treating chambers 260 are disposed along the lengthwise direction of the transfer chamber 240. Furthermore, other liquid treating chambers 260 are stacked one above another. That is, the liquid treating chambers 260 may be disposed in an A×B array on the one side of the transfer chamber 240. Here, "A" denotes the number of liquid treating chambers 260 provided in a row along the first direction 12, and "B" denotes the number of liquid treating chambers 260 provided in a column along the third direction 16. When four or six liquid treating chambers 260 are provided on the one side of the transfer chamber 240, the liquid treating chambers 260 may be disposed in a 2×2 or 3×2 array. The number of liquid treating chambers 260 may be increased or decreased. Furthermore, similarly to the liquid treating chambers 260, a plurality of laser treating chambers 280 may be disposed on an opposite side of the transfer chamber 240. Unlike the above description, the arrangement of the liquid treating chambers 260 and the laser treating chambers 280 may be modified in various ways. For example, the liquid treating chambers 260 and the laser treating chambers 280 may be provided on only the one side of the transfer chamber 240. Alternatively, the liquid treating chambers 260 and the laser treating chambers 280 may be provided in a single layer on the opposite sides of the transfer chamber 240.

The buffer unit 220 is disposed between the transfer frame 140 and the transfer chamber 240. The buffer unit 220 provides a space in which the substrates W stay before the substrates W are transferred between the transfer chamber 240 and the transfer frame 140. The buffer unit 220 has slots (not illustrated) in which the substrates W are placed. The slots (not illustrated) are spaced apart from each other along the third direction 16. The buffer unit 220 is open at one side facing the transfer frame 140 and at an opposite side facing the transfer chamber 240.

The transfer frame 140 transfers the substrates W between the carriers 130 seated on the load ports 120 and the buffer unit 220. An index rail 142 and an index robot 144 are provided in the transfer frame 140. The index rail 142 is provided such that the lengthwise direction thereof is parallel to the second direction 14. The index robot 144 is installed on the index rail 142 and rectilinearly moves along the index rail 142 in the second direction 14. The index robot 144 has a base 144a, a body 144b, and an index arm 144c. The base 144a is installed so as to be movable along the index rail 142. The body 144b is coupled to the base 144a. The body 144b is movable on the base 144a along the third direction 16. Furthermore, the body 144b is rotatable on the base 144a. The index arm 144c is coupled to the body 144b and is movable forward and backward relative to the body 144b. A plurality of index arms 144c are provided. The index arms 144c are individually driven. The index arms 144c are stacked one above another with a spacing gap therebetween along the third direction 16. Some of the index arms 144c may be used to transfer the substrates W from the process module 200 to the carriers 130, and the other index arms 144c may be used to transfer the substrates W from the carriers 130 to the process module 200. Accordingly, particles generated from the substrates W that are to be treated may be prevented from adhering to the treated substrates W in a process in which the index robot 144 transfers the substrates W between the carriers 130 and the process module 200.

The transfer chamber 240 transfers the substrates W between the buffer unit 220 and the liquid treating chambers 260, between the buffer unit 220 and the laser treating chambers 280, between the liquid treating chambers 260, between the laser treating chambers 280, and between the liquid treating chambers 260 and the laser treating chambers 280. That is, the transfer chamber 240 serves as a transfer unit that transfers the substrates W. A guide rail 242 and a main robot 244 are provided in the transfer chamber 240. The guide rail 242 is disposed such that the lengthwise direction thereof is parallel to the first direction 12. The main robot 244 is installed on the guide rail 242 and rectilinearly moves on the guide rail 242 along the first direction 12. The main robot 244 has a base 244a, a body 244b, and a main arm 244c. The base 244a is installed so as to be movable along the guide rail 242. The body 244b is coupled to the base 244a. The body 244b is movable on the base 244a along the third direction 16. Furthermore, the body 244b is rotatable on the base 244a. The main arm 244c is coupled to the body 244b and is movable forward and backward relative to the body 244b. A plurality of main arms 244c are provided. The main arms 244c are individually driven. The main arms 244c are stacked one above another with a spacing gap therebetween along the third direction 16.

Each of the liquid treating chambers 260 performs a process of liquid-treating the substrate W by dispensing treating liquids onto the substrate W. The treating liquids may include a chemical, a rinsing solution, and an organic solvent. The chemical may be a liquid having the property of acid or base. The chemical may include sulfuric acid ($H_2SO_4$), phosphoric acid ($P_2O_5$), hydrofluoric acid (HF), and ammonium hydroxide ($NH_4OH$). The chemical may be a diluted sulfuric acid peroxide (DSP) mixture. The rinsing solution may be deionized water (H₂O). The organic solvent may be isopropyl alcohol (IPA).

The liquid treating chambers 260 may perform cleaning processes. Substrate treating apparatuses provided in the liquid treating chambers 260 may have different structures depending on the types of the cleaning processes performed. Alternatively, the substrate treating apparatuses provided in the liquid treating chambers 260 may have the same structure. Selectively, the liquid treating chambers 260 may be divided into a plurality of groups. Substrate treating apparatuses in the liquid treating chambers 260 belonging to the same group may have the same structure, and substrate treating apparatuses in the liquid treating chambers 260 belonging to different groups may have different structures. Furthermore, the liquid treating chambers 260 may perform various processes such as photolithography, ashing, etching, and the like.

The laser treating chambers 280 may perform a process of treating the substrate W by applying a laser to the substrate W. Substrate treating apparatuses 300 may be provided in the laser treating chambers 280, respectively. Each of the substrate treating apparatuses 300 may apply a laser to the substrate W. The substrate treating apparatus 300 may apply the laser to an edge area of the substrate W. The substrate treating apparatus 300 may perform a process of removing a film on the substrate W by applying the laser to the edge area of the substrate W.

Figure 4:
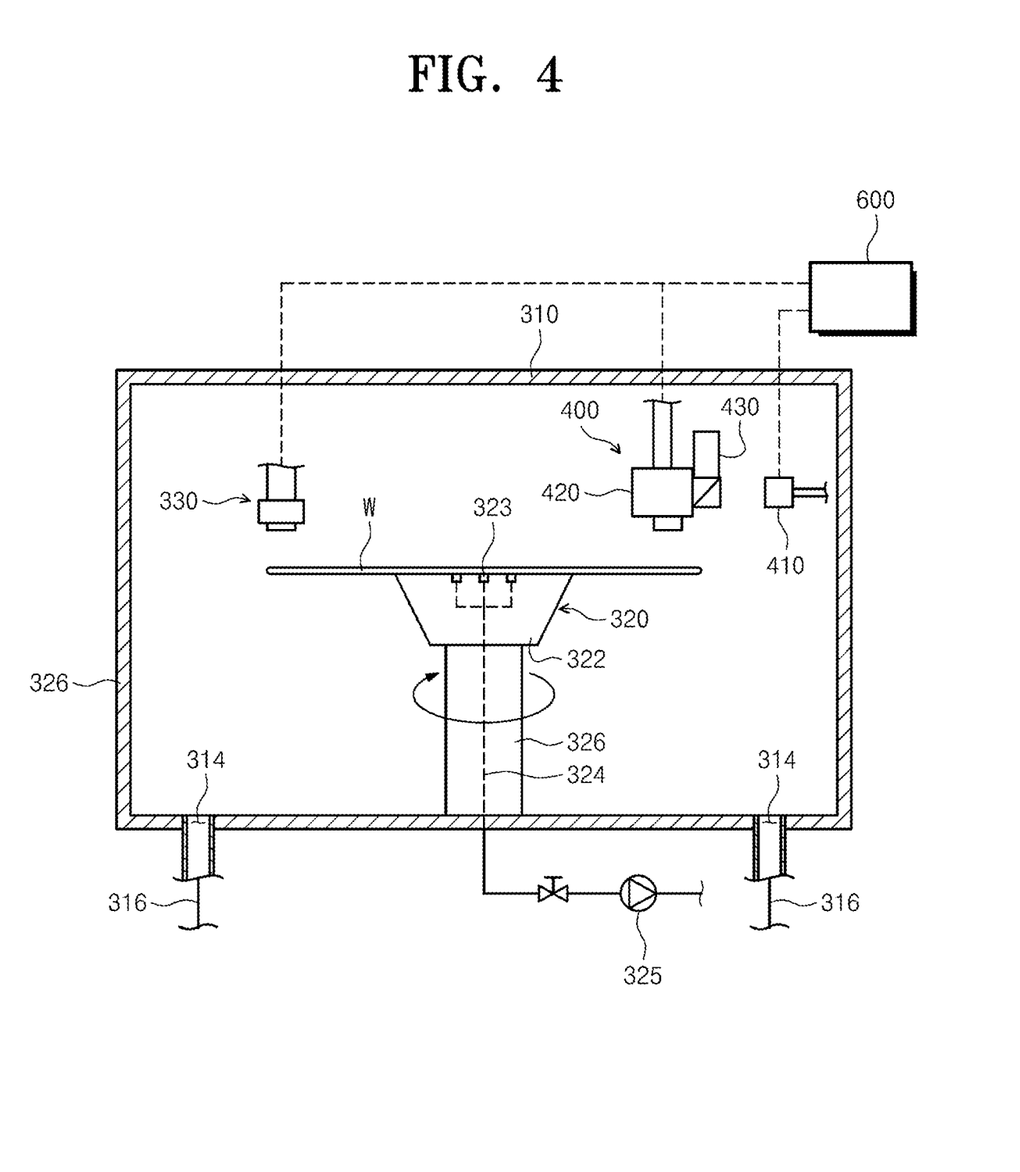
FIG. 4 is a sectional view illustrating a substrate treating apparatus of FIG. 3.

Hereinafter, the substrate treating apparatus 300, which is provided in each of the laser treating chambers 280, will be described in detail. FIG. 4 is a sectional view illustrating the substrate treating apparatus of FIG. 3. Referring to FIG. 4, the substrate treating apparatus 300 may include a housing 310, a support unit 320, a measurement unit 330, a laser unit 400, and a controller 600.

The housing 310 has an interior space 312. The interior space 312 may serve as a space in which the substrate W is treated. An opening (not illustrated) is formed in one side of the housing 310. The opening functions as an entrance/exit opening through which the substrate W is placed in or extracted from the housing 310. A door (not illustrated) is installed in the opening. The door opens or closes the opening. When a substrate treating process is performed, the door closes the opening to seal the interior space 312 of the housing 310 from the outside. An exhaust hole 314 is formed in the bottom of the housing 310. The exhaust hole 314 is connected with an exhaust line 316. Accordingly, by-products generated while the substrate W is treated in the interior space 312 may be released outside the substrate treating apparatus 300. Furthermore, a gas supply line (not illustrated) may be connected to the housing 310 to supply gas into the interior space 312. The gas may be an inert gas such as nitrogen. The gas supplied by the gas supply line may form a gas flow in the interior space 312. The gas flow formed in the interior space 312 enables the by-products generated during the treatment of the substrate W to be more efficiently released.

The support unit 320 supports and rotates the substrate W. The support unit 320 may include a support plate 322 and a rotary shaft 326. The support plate 322 supports the substrate W. The support plate 322 has a circular plate shape. An upper surface of the support plate 322 may have a larger diameter than a lower surface of the support plate 322. A side surface of the support plate 322 that connects the upper surface and the lower surface of the support plate 322 may be downwardly inclined toward the central axis of the support plate 322. The upper surface of the support plate 322 serves as a seating surface on which the substrate W is seated. The seating surface has a smaller area than the substrate W. According to an embodiment, the diameter of the seating surface may be smaller than the radius of the substrate W. The seating surface supports a central area of the substrate W. A plurality of suction holes 323 are formed in the seating surface. The suction holes 323 may be holes through which vacuum pressure is applied to the substrate W on the seating surface to clamp the substrate W. A vacuum member 325 is connected to the suction holes 323. The vacuum member 325 may be a pump for evacuating the suction holes 323. Without being limited thereto, however, the vacuum member 325 may include various well-known parts for applying vacuum pressure to the suction holes 323.

The rotary shaft 326 has a cylindrical shape, the lengthwise direction of which is oriented in the vertical direction. The rotary shaft 326 is coupled to the lower surface of the support plate 322. An actuator (not illustrated) transmits torque to the rotary shaft 326. The rotary shaft 326 is rotatable about the central axis thereof by the torque transmitted from the actuator. The support plate 322 is rotatable together with the rotary shaft 326. The actuator may adjust the rotating speed of the rotary shaft 326 to adjust the rotating speed of the substrate W. For example, the actuator may be a motor. Without being limited thereto, however, the actuator may include various well-known parts for applying torque to the rotary shaft 326.

The measurement unit 330 may measure the thickness of a film F on the substrate W. For example, the measurement unit 330 may measure the thickness of the film F on an edge area of the substrate W. The measurement unit 330 may measure the thickness of the film F on the substrate W and may transmit the measured thickness value of the film F to the controller 600 that will be described below. The measurement unit 330 may be disposed above the substrate W supported on the support unit 320. For example, the measurement unit 330 may be disposed above the edge area of the substrate W supported on the support unit 320. Furthermore, the position in which the measurement unit 330 is provided may be variously changed. For example, the position of the measurement unit 330 may be variously changed in the horizontal direction and/or the vertical direction.

Figure 5:
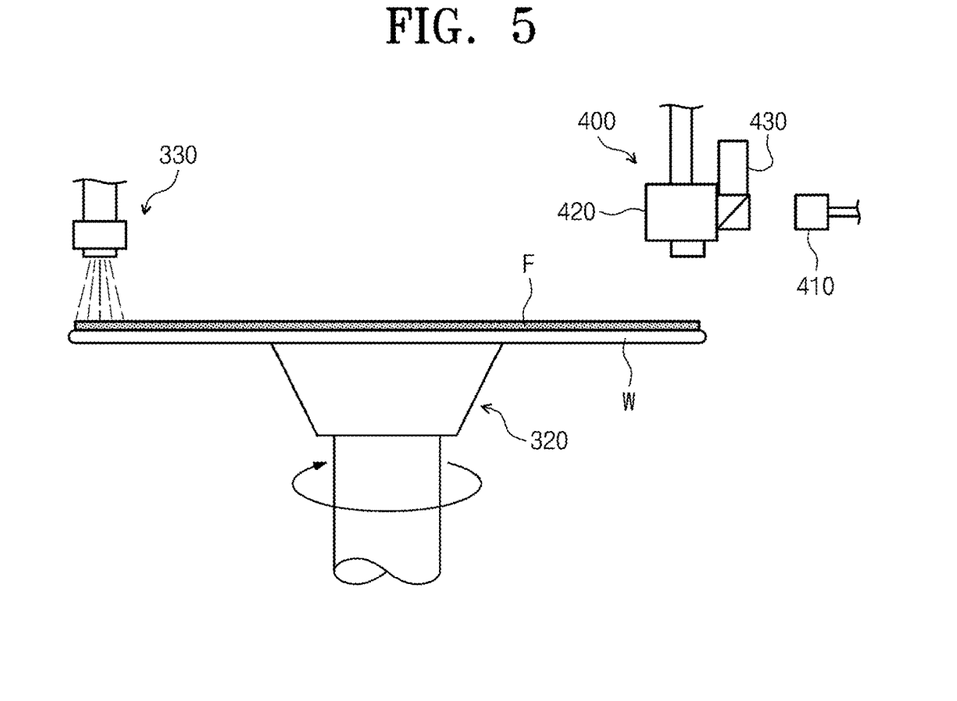
FIG. 5 is a view illustrating a state in which a measurement unit of FIG. 4 measures the thickness of a film on a substrate.

FIG. 5 is a view illustrating a state in which the measurement unit of FIG. 4 measures the thickness of the film on the substrate. Referring to FIG. 5, the measurement unit 330 may be disposed above the edge area of the substrate W. The measurement unit 330 may emit light having a set wavelength to the edge area of the substrate W. The measurement unit 330 may measure the thickness of the film F on the substrate W, based on the degree to which the light emitted to the edge area of the substrate W is reflected. Furthermore, when the measurement unit 330 measures the thickness of the film F of the edge area on the substrate W, the support unit 320 may rotate the substrate W. Accordingly, the measurement unit 330 may measure the thicknesses of the entire film F of the edge area on the substrate W without a change in the position of the measurement unit 330. In addition, the measurement unit 330 may measure the type of the film F, in addition to the thickness values of the film F.

In the above-described embodiment, it has been exemplified that the measurement unit 330 measures the thickness of the film F on the substrate W by emitting the light having the set wavelength to the edge area of the substrate W. However, the inventive concept is not limited thereto. For example, the measurement unit 330 may include various well-known parts for measuring the thickness of the film F on the substrate W.

Figure 6:
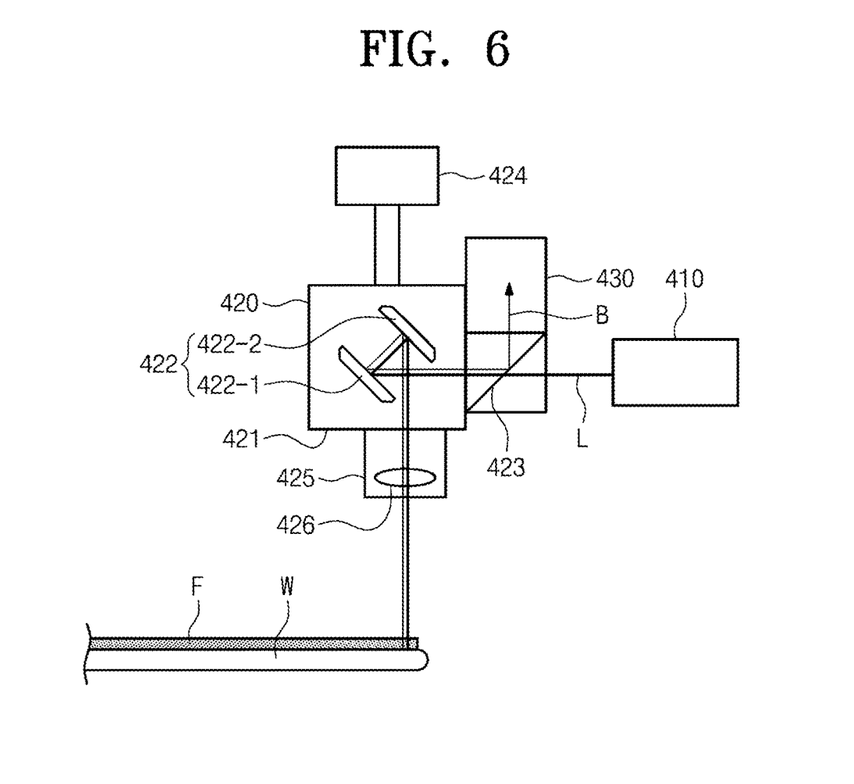
FIG. 6 is a sectional view illustrating a laser unit of FIG. 4.

FIG. 6 is a sectional view illustrating the laser unit of FIG. 4. Referring to FIG. 6, the laser unit 400 may apply a laser to the substrate W supported on the support unit 320. The laser unit 400 may apply a pulsed laser to the substrate W. Furthermore, the laser unit 400 may apply the pulsed laser to the edge area of the substrate W. The pulsed laser applied by the laser unit 400 may be used to remove the film F on the edge area of the substrate W. The laser unit 400 may include a laser source 410, an adjustment unit 420, and a vision member 430.

The laser source 410 may emit a pulsed laser L. The laser source 410 may be a source of the pulsed laser L applied to the substrate W. Furthermore, the laser source 410 may variously change the wavelength of the pulsed laser L. For example, the laser source 410 may change the wavelength of the pulsed laser L such that the pulsed laser L has a wavelength of 150 nm to 1200 nm. This is because the substrate W as well as the film F on the substrate W is etched when the pulsed laser L has a wavelength of 150 nm or less and the film F on the substrate W is not removed when the pulsed laser L has a wavelength of 1200 nm or more.

The pulsed laser L emitted by the laser source 410 may be an ultra-short pulsed laser. For example, the pulsed laser L may be a laser having a pulse width of tens of ns to hundreds of fs. When the ultra-short pulsed laser is applied to the film F on the substrate W by a non-heat and non-contact process, an immediate ablation phenomenon may occur on the film F. Accordingly, it is possible to remove the film F from an unnecessary portion of the edge area of the substrate W.

Furthermore, the laser source 410 may change the shape of the pulsed laser L. For example, the laser source 410 may make a change such that the pulsed laser L has a circular shape. Alternatively, the laser source 410 may make a change such that the pulsed laser L emitted from the laser source 410 has a quadrangular shape. The quadrangular shape may be a square shape or a rectangular shape. In another case, the laser source 410 may make a change such that the pulsed laser L has the shape of a quadrangle with rounded corners.

The adjustment unit 420 may change the position to which the pulsed laser L emitted from the laser source 410 is applied. The adjustment unit 420 may change the position to which the pulsed laser L is applied, based on an offset value measured by the vision member 430 that will be described below. The adjustment unit 420 may include a body 421, a light reflector 422, a light splitter 423, a drive member 424, and a lighting unit 425.

The light reflector 422 may be provided inside the body 421. The light reflector 422 may change the direction in which the pulsed laser L emitted from the laser source 410 is applied. For example, the light reflector 422 may change the direction in which the pulsed laser L is applied, such that the direction in which the pulsed laser L emitted from the laser source 410 is applied and the direction in which the vision member 430 takes an image are parallel to each other and the position where the pulsed laser L is applied to the substrate W overlaps the area of the substrate W that the vision member 430 takes an image of.

Furthermore, a plurality of light reflectors 422 may be provided. The light reflectors 422 may more precisely control the direction in which the pulsed laser L is applied. For example, the light reflector 422 may include a first light reflector 422-1 and a second light reflector 422-2. The first light reflector 422-1 may receive the pulsed laser L emitted from the laser source 410. The pulsed laser L received by the first light reflector 422-1 may be delivered to the second light reflector 422-2 by being reflected by the first light reflector 422-1. The pulsed laser L received by the second light reflector 422-2 may be applied to the edge area of the substrate W by being reflected by the second light reflector 422-2.

The light splitter 423 may transmit light having a specific wavelength and may reflect light having different wavelengths. For example, the light splitter 423 may transmit the pulsed laser L emitted from the laser source 410 and may deliver the pulsed laser L to the light reflector 422.

The lighting unit 425 may be provided on the bottom of the body 421. The lighting unit 425 may emit light B to the edge area of the substrate W. The lighting unit 425 may be implemented with a light emitting diode (LED). Without being limited thereto, however, the lighting unit 425 may include various well-known parts for emitting the light B. Furthermore, a lens 426 may be disposed in the center of the lighting unit 425 to focus the light B. The lighting unit 425 may have a ring shape and may surround the periphery of the lens 426.

The light B emitted from the lighting unit 425 may be reflected by colliding with the substrate W. The light B reflected from the substrate W may be delivered to the light reflector 422. The light B delivered to the light reflector 422 may be delivered to the light splitter 423. The light B emitted from the lighting unit 425 may have a wavelength by which the light B is reflected by the light splitter 423. Accordingly, the light delivered to the light splitter 423 may be delivered to the vision member 430.

Figure 7:
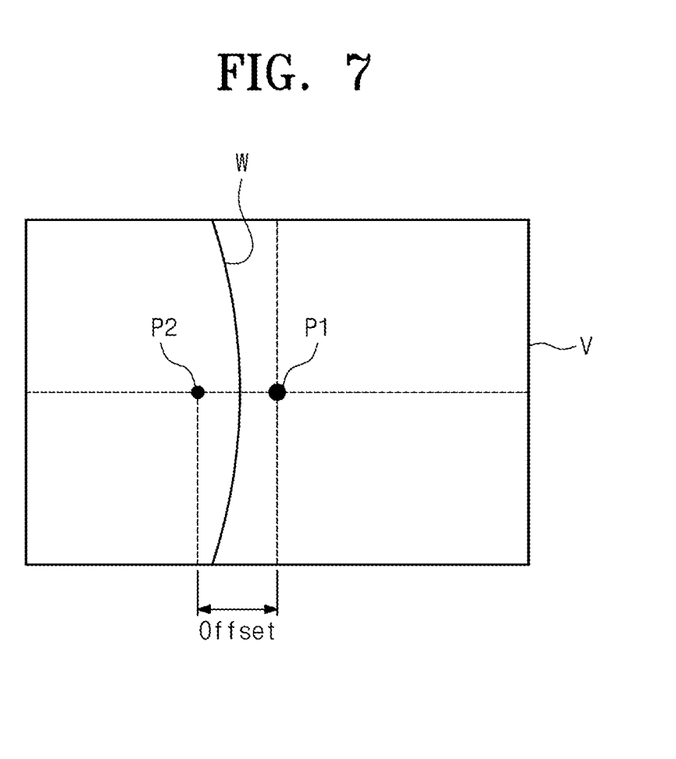
FIG. 7 is a view illustrating one example of an image of an edge area of the substrate taken by a vision member of FIG. 6.

FIG. 7 is a view illustrating one example of an image V of the edge area of the substrate taken by the vision member of FIG. 6. Referring to FIGS. 6 and 7, the vision member 430 may receive the light B emitted from the lighting unit 425. As described above, the light B emitted from the lighting unit 425 may be sequentially delivered to the light reflector 422 and the light splitter 423. The light B delivered to the light splitter 423 may be delivered to the vision member 430. Accordingly, the vision member 430 may take an image of the edge area of the substrate W. Furthermore, the vision member 430 may measure an offset value between an illuminated position P1 and a set position P2. The illuminated position P1 refers to a position to which the pulsed laser L emitted by the laser source 410 is applied, and the set position P2 refers to a position to which the pulsed laser L is required to be applied. That is, the vision member 430 may measure the offset value between the illuminated position P1 and the set position P2 and may transmit the measured offset value to the controller 600. When the offset value is transmitted to the controller 600, the controller 600 may output a control signal to control the drive member 424. The drive member 424 receiving the control signal may shift the position of the body 421. Furthermore, the drive member 424 receiving the control signal may change the slope of the body 421. Accordingly, the drive member 424 may allow the illuminated position P1 and the set position P2 to coincide with each other. When the illuminated position P1 and the set position P2 coincide with each other, the laser unit 400 may apply the pulsed laser L to the substrate W.

Referring again to FIG. 4, the controller 600 may control the substrate treating equipment 10. For example, the controller 600 may perform control such that the substrate W is transferred between the liquid treating chambers 260, between the laser treating chambers 280, and between the liquid treating chambers 260 and the laser treating chambers 280. Further, the controller 600 may control the substrate treating apparatus 300. For example, the controller 600 may control the support unit 320, the measurement unit 330, and the laser unit 400. Furthermore, the controller 600 may control the laser unit 400 to apply the pulsed laser L to the edge area of the substrate W. Moreover, the controller 600 may control the measurement unit 330 to measure the thickness of the film F on the edge area of the substrate W. In addition, the controller 600 may control the substrate treating apparatus 300 to perform a film removing method or a substrate treating method that will be described below.

Figure 8:
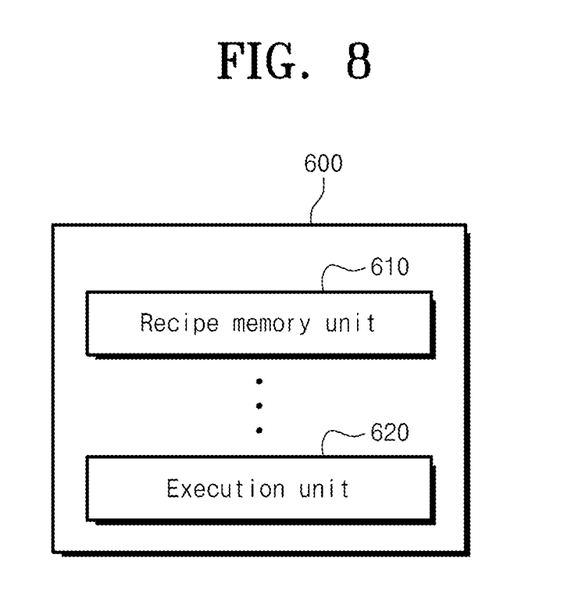
FIG. 8 is a view illustrating a configuration of a controller of FIG. 4.

FIG. 8 is a view illustrating a configuration of the controller 600 of FIG. 4. Referring to FIG. 8, the controller 600 may include a recipe memory unit 610 and an execution unit 620.

Figure 9:
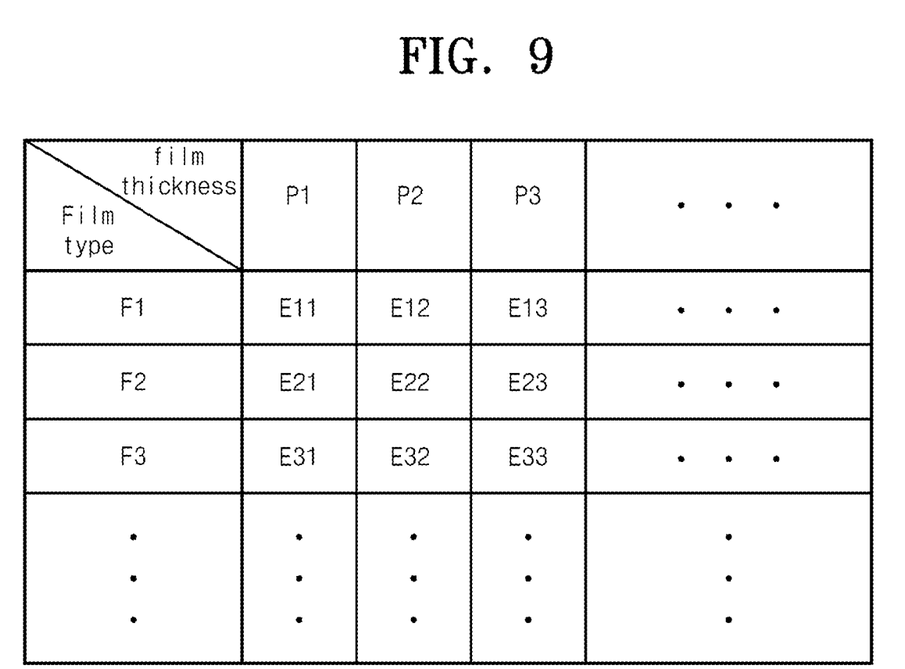
FIG. 9 is a table illustrating one example of treatment conditions according to an embodiment of the inventive concept.

As illustrated in FIG. 9, treatment conditions for removing the film F on the substrate W may be recorded in the recipe memory unit 610. For example, the treatment conditions recorded in the recipe memory unit 610 may include magnitudes of ablation energies depending on types of the film F and thickness values of the film F. Here, the ablation energies may refer to energies required to completely remove the film F depending on the types of the film F and the thickness values of the film F. For example, when the film F on the substrate W is a first film F1 and the first film F1 has a first thickness D1, ablation energy required to completely remove the first film F1 may be ablation energy 1-1 E11. In another example, when the film F on the substrate W is a second film F2 and the second film F2 has a third thickness D3, ablation energy required to completely remove the second film F2 may be ablation energy 2-3 E23. Furthermore, the ablation energy values recorded in the recipe memory unit 610 may be treatment conditions recorded in the recipe memory unit 610 in advance based on a plurality of experiments.

The execution unit 620 may output control signals. The control signals output by the execution unit 620 may be used to control the components of the substrate treating apparatus 300. Furthermore, the execution unit 620 may read a treatment condition from the recipe memory unit 610 and may output a control signal to control the substrate treating apparatus 300, based on the read treatment condition.

Hereinafter, one example in which the execution unit 620 outputs a control signal will be described. When the measurement unit 330 measures the type of the film F on the substrate W and the thickness of the film F, the measurement unit 330 may transmit the measurement values to the controller 600. When the measurement values measured by the measurement unit 330 are transmitted to the controller 600, the execution unit 620 may read an appropriate treatment condition among the treatment conditions recorded in the recipe memory unit 610. The execution unit 620 may output a control signal corresponding to the treatment condition. For example, when the measurement unit 330 measures the type of the film F to be the first film F1 and measures the thickness of the first film F1 to be the first thickness D1, the execution unit 620 may read ablation energy 1-1 E11 among the ablation energies recorded in the recipe memory unit 610. Thereafter, the execution unit 620 may control the laser unit 400 such that a pulsed laser emitted by the laser unit 400 has pulse energy corresponding to ablation energy 1-1 E11. The output of the control signal by the execution unit 620 is not limited to the above-described example and may be variously modified depending on the type of the film F on the substrate W and the thickness of the film F.

Figure 10:
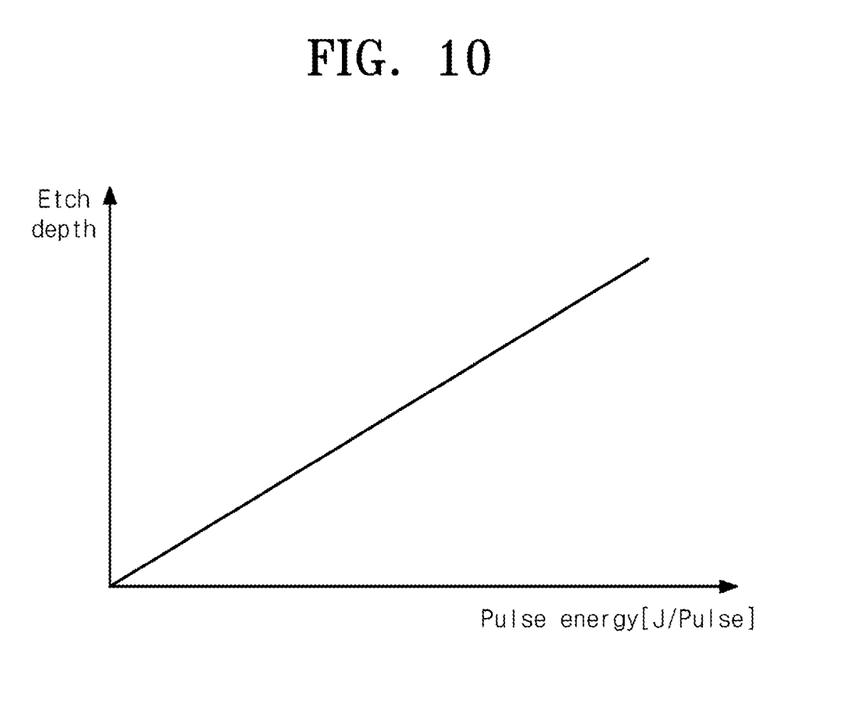
FIG. 10 is a graph depicting a relationship between pulse energy of a pulsed laser and an etch depth of a film on a substrate.

Hereinafter, a method of controlling pulse energy by a control signal output by the execution unit 620 will be described in detail. FIG. 10 is a graph depicting a relationship between pulse energy of a pulsed laser and an etch depth of a film on a substrate. Referring to FIG. 10, the etch depth of the film F on the substrate W increases as the pulse energy of the pulsed laser applied to the substrate W increases. That is, the pulse energy of the pulsed laser applied to the substrate W has to be increased with an increase in the thickness of the film F to be removed.

A relationship between the pulse energy, output power of the pulsed laser, and a repetition rate of the pulsed laser is as follows.

$$\text{Pulse Energy} \left[ \frac{J}{\text{Pulse}} \right] = \frac{\text{Output Power} [W]}{\text{Repetition Rate [Hz]}}$$

That is, the execution unit 620 may output a control signal to increase the pulse energy as the thickness of the film F to be removed from the substrate W increases. For example, to increase the pulse energy of the pulsed laser, the execution unit 620 may output a control signal to increase the output power of the pulsed laser. Furthermore, to increase the pulse energy of the pulsed laser, the execution unit 620 may output a control signal to decrease the repetition rate of the pulsed laser. In addition, the execution unit 620 may adjust the pulse energy of the pulsed laser by outputting a control signal to control the output power of the pulsed laser and the repetition rate of the pulsed laser.

Hereinafter, a substrate treating method according to an embodiment of the inventive concept will be described in detail. The substrate treating method may be a method of removing the film F on the substrate W by applying a plurality of unit pulsed lasers to the edge area of the substrate W. The film F on the substrate W may be a film formed by a deposition process. For example, the film F on the substrate W may be TiN, SiN, $SiO_2$, tungsten, oxide, or the like. However, the substrate treating method according to the embodiment of the inventive concept is not limited to the method of removing the film F and may be similarly applied to various treating methods of treating the substrate W by applying a laser to the substrate W.

Figure 11:
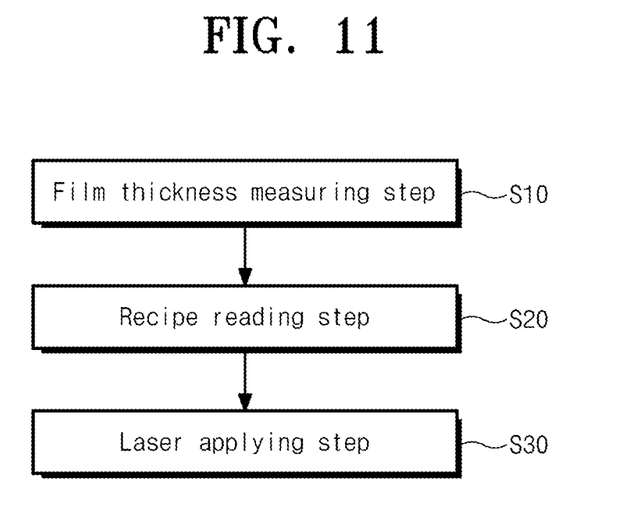
FIG. 11 is a flowchart illustrating a substrate treating method according to an embodiment of the inventive concept.
Figure 12:
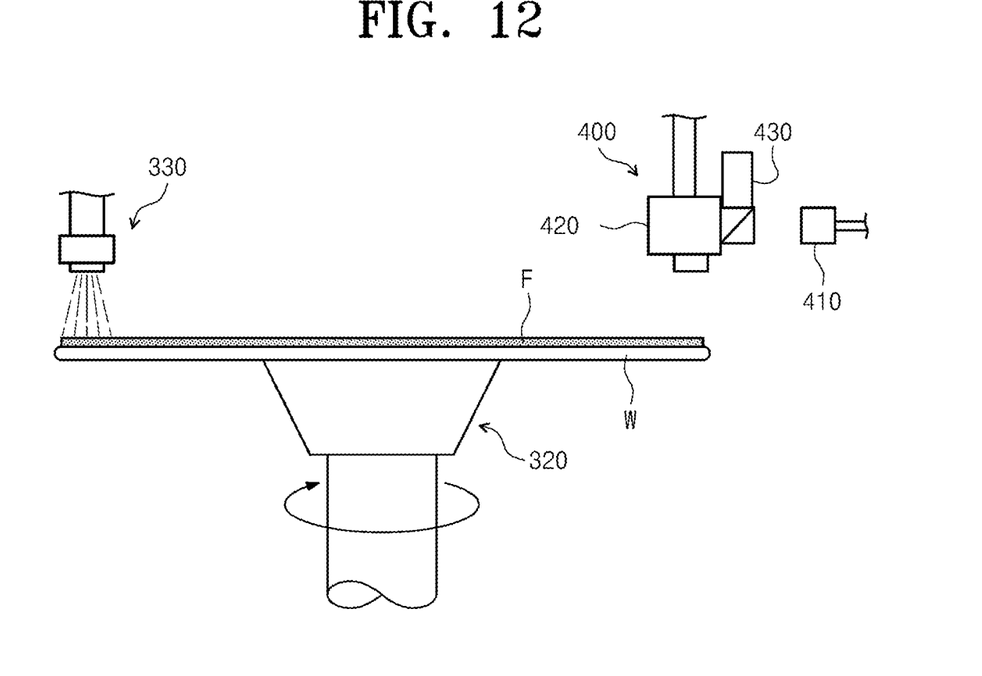
FIGS. 12 and 13 are views illustrating the substrate treating method according to the embodiment of the inventive concept.
Figure 13:
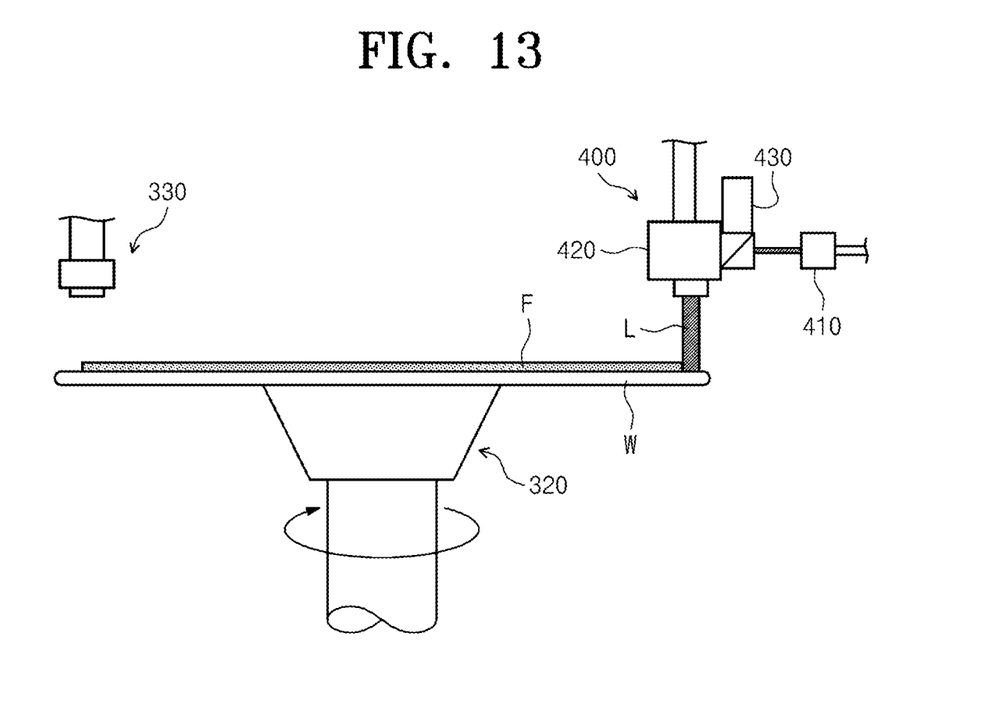

FIG. 11 is a flowchart illustrating the substrate treating method according to the embodiment of the inventive concept, and FIGS. 12 and 13 are views illustrating the substrate treating method according to the embodiment of the inventive concept. Referring to FIGS. 11 to 13, the substrate treating method according to the embodiment of the inventive concept may include film thickness measuring step S10, recipe reading step S20, and laser applying step S30. Film thickness measuring step S10, recipe reading step S20, and laser applying step S30 may be sequentially performed.

Film thickness measuring step S10 is a step of measuring the thickness of the film F on the substrate W. For example, in film thickness measuring step S10, as illustrated in FIG. 12, the measurement unit 330 may be located above the edge area of the substrate W. In film thickness measuring step S10, the measurement unit 330 may measure the thickness of the film F on the substrate W by emitting light having the set wavelength to the substrate W. Furthermore, in film thickness measuring step S10, the support unit 320 may rotate the substrate W. In addition, in film thickness measuring step S10, the type of film F on the substrate W may be detected.

Recipe reading step S20 is a step of reading a treatment condition appropriate for treating the substrate W, based on the measurement values measured in film thickness measuring step S10. For example, in recipe reading step S20, depending on the thickness value of the film F measured in film thickness measuring step S10, a condition for ablation energy required to completely remove the film F may be read from the recipe memory unit 610.

Laser applying step S30 is a step of applying a pulsed laser to the substrate W, based on the treatment condition read from the recipe memory unit 610 in recipe reading step S20. In laser applying step S30, pulse energy of the pulsed laser may be selected based on the ablation energy read from the recipe memory unit 610 in recipe reading step S20. For example, in laser applying step S30, pulse energy corresponding to the ablation energy read from the recipe memory unit 610 in recipe reading step S20 may be selected. In laser applying step S30, as illustrated in FIG. 13, the laser unit 400 may be located above the edge area of the substrate W. In laser applying step S30, the support unit 320 may rotate the substrate W while the pulsed laser L is applied to the edge area of the substrate W. Furthermore, in laser applying step S30, the position to which the pulsed laser L is applied may be changed along the radial direction of the substrate W. Accordingly, the edge area of the substrate W from which the film F is removed may be changed (e.g., increased or decreased).

In general, in the case of removing a film by dispensing a chemical onto an edge area of a substrate, the film may not be appropriately removed. For example, the film on the substrate may be removed so as to be downwardly inclined along the radial direction of the substrate. This is caused by a non-uniform selectivity of the chemical used to remove the film. When the film is not appropriately removed, the production yield of semiconductor elements is lowered. Furthermore, a pin mark is formed on the surface of the substrate to cause additional contamination. However, according to the embodiment of the inventive concept, a pulsed laser is applied to the substrate W to remove the film F on the substrate W. Accordingly, immediate ablation of the film F on the substrate W may occur, and thus the film F may be removed at a uniform and high selectivity. Furthermore, according to the embodiment of the inventive concept, as the film F on the substrate W is removed by using the pulsed laser, the area where the film F is removed from the substrate W may be variously changed. In addition, the area where the film F is removed from the substrate W may be made finer. Variously changing the area where the film F is removed from the substrate W and making the area finer are consistent with a recent tendency to reduce an area where a film is removed from an edge area of a substrate.

In the case of removing the film F on the substrate W by applying the pulsed laser to the substrate W, an over etch phenomenon or an under etch phenomenon may occur. The over etch phenomenon is a phenomenon in which the substrate W is damaged by being etched together with the film F. The over etch phenomenon occurs when pulse energy of the pulsed laser applied to the substrate W exceeds ablation energy. The under etch phenomenon is a phenomenon in which the film F on the substrate W remains on the substrate W without being completely removed. The under etch phenomenon occurs when pulse energy of the pulsed laser applied to the substrate W is smaller than the ablation energy. That is, the over etch phenomenon or the under etch phenomenon may damage the substrate W or may degrade efficiency in treating the substrate W. However, according to the embodiment of the inventive concept, pulse energy of the pulsed laser is selected based on a measurement value obtained by measuring the thickness of the film F on the substrate W. That is, as the pulsed laser having pulse energy corresponding to the ablation energy is applied to the substrate W, the over etch phenomenon or the under etch phenomenon may be minimized.

Figure 14:
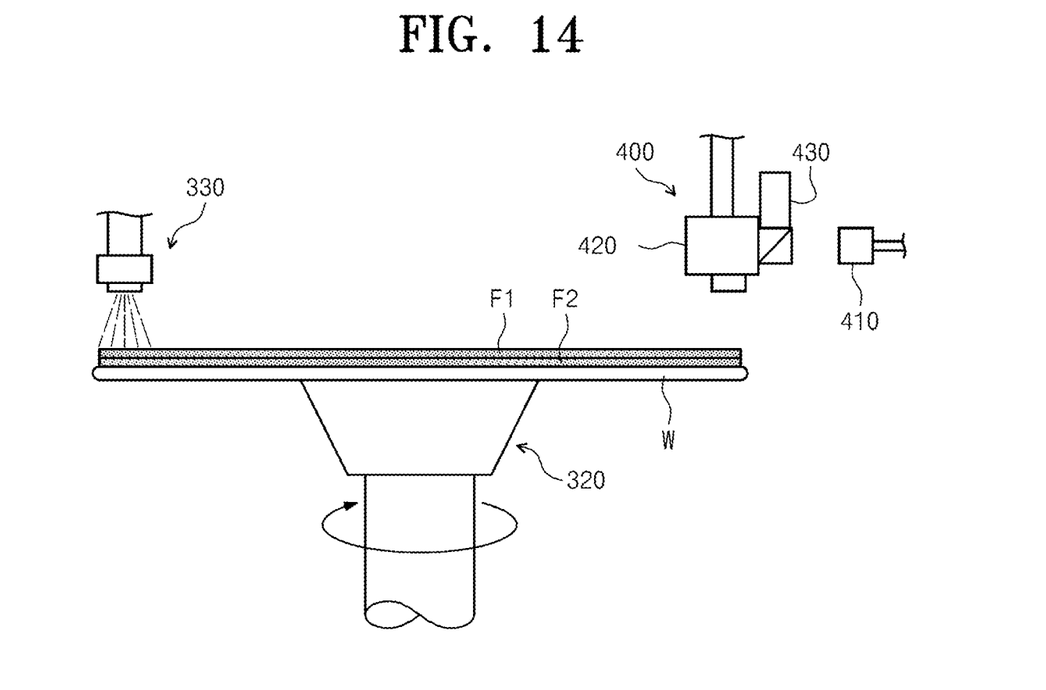
FIGS. 14 to 16 are views illustrating a substrate treating method according to another embodiment of the inventive concept.
Figure 15:
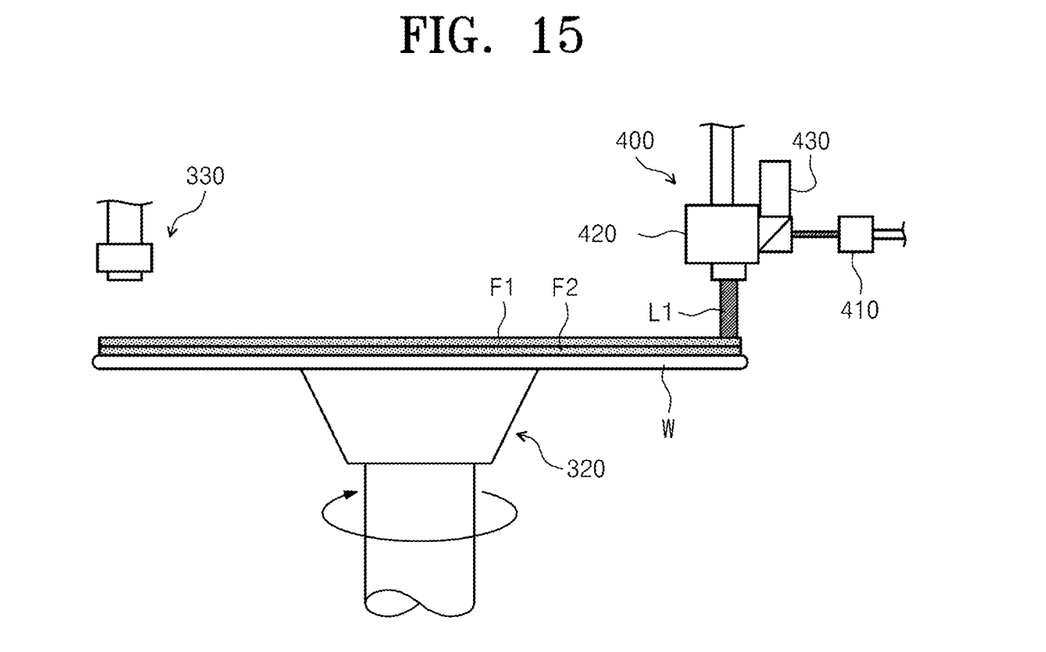
Figure 16:
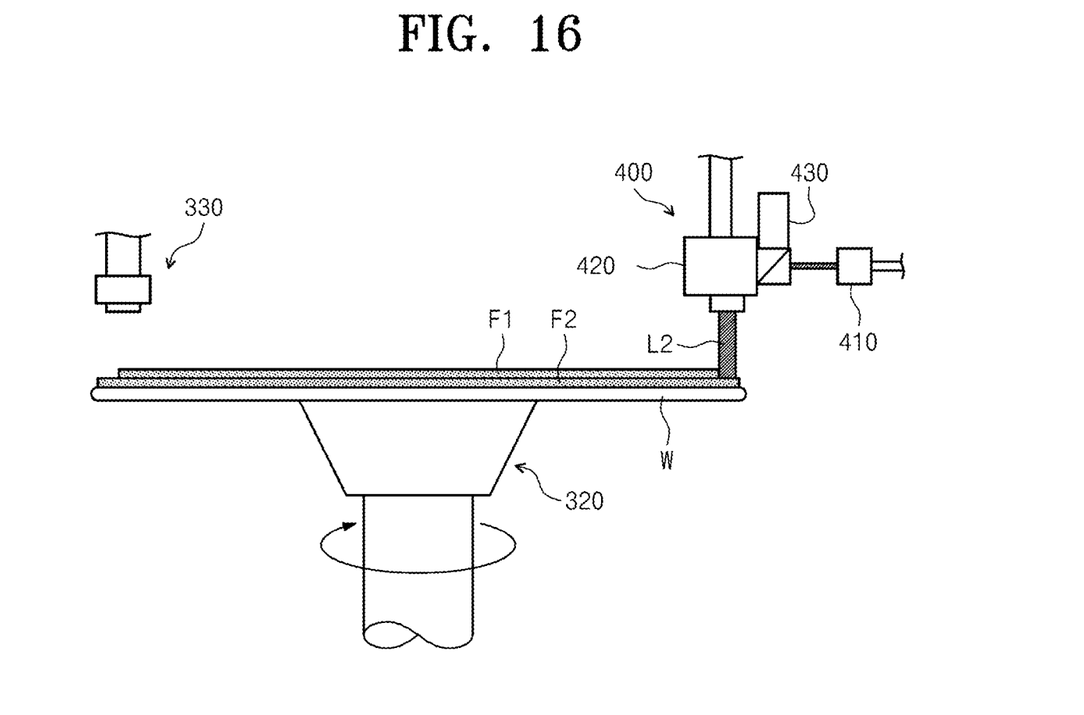

Hereinafter, a substrate treating method according to another embodiment of the inventive concept will be described. The following description will be focused on a difference between the embodiment and the other embodiment of the inventive concept, and descriptions of identical or similar items will be omitted. FIGS. 14 to 16 are views illustrating the substrate treating method according to the other embodiment of the inventive concept. Referring to FIGS. 14 to 16, a film F on a substrate W may include a first film F1 and a second film F2. The first film F1 and the second film F2 may be different films. The first film F1 and the second film F2 may be stacked on each other. In the substrate treating method according to the other embodiment of the inventive concept, the measurement unit 330 may measure the thicknesses of the first film F1 and the second film F2 by emitting light to an edge area of the substrate W. Furthermore, the measurement unit 330 may detect the types of the first film F1 and the second film F2. When the measurement unit 330 measures or detects the information about the first film F1 and the second film F2, the measurement unit 330 may transmit the measured or detected information to the controller 600. When removing the first film F1, the controller 600 may output a control signal such that a pulsed laser L1 applied by the laser unit 400 has pulse energy corresponding to first ablation energy. The first ablation energy refers to energy required to completely remove the first film F1 depending on the thickness value of the first film F1. Furthermore, when removing the second film F2, the controller 600 may output a control signal such that a pulsed laser L2 applied by the laser unit 400 has pulse energy corresponding to second ablation energy. The second ablation energy refers to energy required to completely remove the second film F2 depending on the thickness value of the second film F2. According to the other embodiment of the inventive concept, even though various types of films F are provided on the substrate W, appropriate pulsed lasers may be applied to remove the films F, and thus substrate treating efficiency may be improved.

Figure 17:
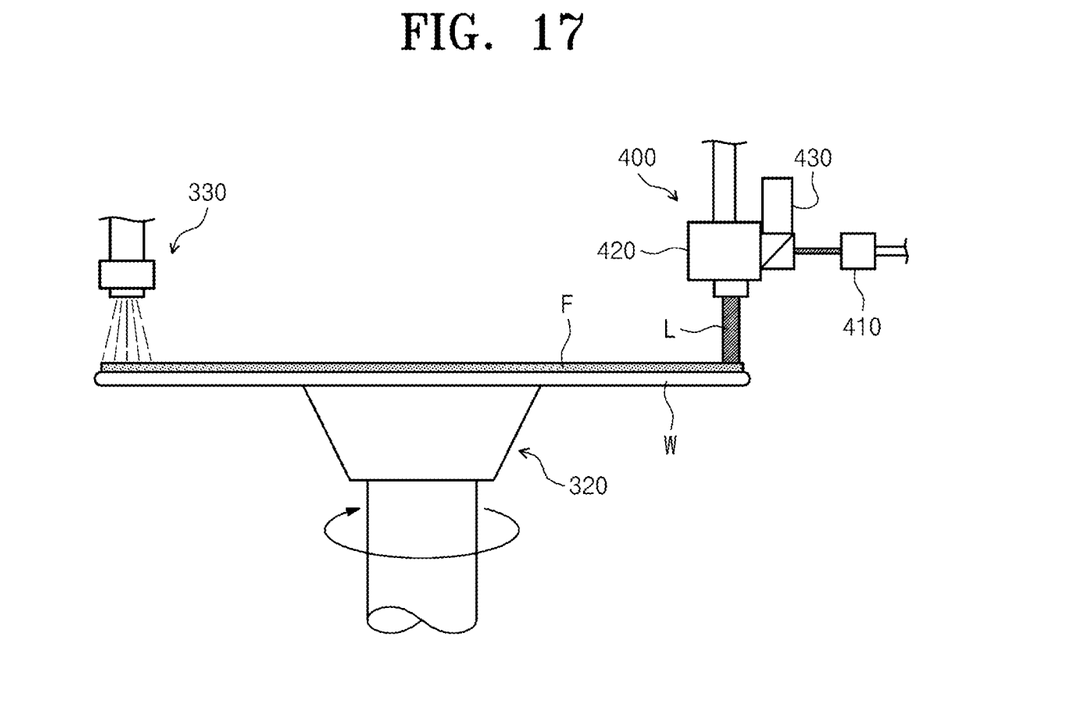
FIG. 17 is a view illustrating a substrate treating method according to another embodiment of the inventive concept.

In the above-described embodiments, it has been exemplified that film thickness measuring step S10, recipe reading step S20, and laser applying step S30 are sequentially performed. However, the inventive concept is not limited thereto. For example, as illustrated in FIG. 17, film thickness measuring step S10, recipe reading step S20, and laser applying step S30 may be simultaneously performed.

In the above-described embodiments, it has been exemplified that the measurement unit 330 and the laser unit 400 are provided in the laser treating chambers 280. However, the inventive concept is not limited thereto. For example, the measurement unit 330 and the laser unit 400 may be provided in the liquid treating chambers 260. In this case, liquid treatment and laser treatment may be performed together on the substrate W in the liquid treating chambers 260, and thus the foot-print of the substrate treating equipment 1 may be minimized.

As described above, according to the embodiments of the inventive concept, the substrate treating method and apparatus may maximize efficiency in removing a film on a substrate.

Further, according to the embodiments of the inventive concept, the substrate treating method and apparatus may improve film removal efficiency by applying a plurality of unit pulsed lasers to a film on a substrate.

Furthermore, according to the embodiments of the inventive concept, the substrate treating method and apparatus may make a film removal area fine and may variously modify the film removal area.

Moreover, according to the embodiments of the inventive concept, the substrate treating method and apparatus may improve substrate treating efficiency by allowing a film on a substrate to be completely removed depending on the thickness of the film on the substrate.

In addition, according to the embodiments of the inventive concept, the substrate treating method and apparatus may minimize damage to a substrate due to an over etch, or improper removal of a film due to an under etch, while removing the film on the substrate.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a housing having an interior space;
   a chuck configured to support and rotate the substrate in the interior space;
   a laser configured to apply a pulsed laser to remove a film on the substrate supported on the chuck;
   a scanner configured to measure thickness of the film on the substrate, the scanner being located in a fixed position above the substrate; and
   a controller configured to control the laser and the scanner,
   wherein the controller includes:
      a recipe memory in which treatment conditions for removing the film on the substrate are recorded; and
      a processor configured to read the treatment conditions from the recipe memory and output a control signal to control pulse energy of the pulsed laser, based on the read treatment conditions,
   wherein the processor:
      reads the treatment conditions from the recipe memory depending on the thickness of the film measured by the scanner; and
      outputs the control signal to control the pulse energy, based on the treatment conditions read from the recipe memory,
   wherein the controller is programmed to cause the scanner to measure the thickness of the film on the substrate before removing the film on the substrate using the pulsed laser,
   wherein the film includes a first film having a first type and a second film having a second type different from the first type of first film, the scanner identifying the first type and the second type during scanning the film,
   wherein the controller is further programmed to, while the chuck is rotating, in real time continuously adjust the pulse energy based on the thickness of the film measured by the scanner and a type of the film being the first type or the second type, and
   wherein the controller is further programmed to:
      while removing the first film, read a first ablation energy, by which the first film is completely removed, from the recipe memory depending on a thickness of the first film and the first type of the first film measured by the scanner among the treatment conditions, and output the control signal to control the pulse energy, based on the first ablation energy read from the recipe memory; and
      while removing the second film, read a second ablation energy, by which the second film is completely removed, from the recipe memory depending on a thickness of the second film and the second type of the second film measured by the scanner among the treatment conditions, and output the control signal to control the pulse energy, based on the second ablation energy read from the recipe memory.

2. The apparatus of claim 1, wherein the controller outputs the control signal such that the pulse energy has energy corresponding to the first ablation energy and the second ablation energy.

3. The apparatus of claim 1, wherein the first film and the second film are stacked on each other.

4. The apparatus of claim 3, wherein the processor:
   when removing the first film, outputs the control signal such that the pulse energy has energy corresponding to the first ablation energy; and
   when removing the second film, outputs the control signal such that the pulse energy has energy corresponding to the second ablation energy.

5. The apparatus of claim 1, wherein the processor adjusts the pulse energy by outputting a control signal to control output power of the pulsed laser and/or a repetition rate of the pulsed laser.

6. The apparatus of claim 1, wherein the controller controls the laser to apply the pulsed laser to an edge area of the substrate.

7. The apparatus of claim 1, wherein the controller controls the scanner such that an area where the thickness of the film is measured corresponds to an edge area of the substrate.

8. The apparatus of claim 1, wherein the laser includes:
   a laser source configured to emit the pulsed laser; and
   a camera configured to take an image of an edge area of the substrate to measure an offset value between an illuminated position and a set position of the pulsed laser, and
   wherein the laser is configured to change the illuminated position, based on the offset value.

* * * * *